(12) United States Patent
Lee

(10) Patent No.: US 6,802,575 B1
(45) Date of Patent: Oct. 12, 2004

(54) RACK MOUNT

(76) Inventor: Harry P. Lee, 548 Corte Aguacate, Camarillo, CA (US) 93010-1861

( * ) Notice: Subject to any disclaimer, the term of this patent is extended or adjusted under 35 U.S.C. 154(b) by 72 days.

(21) Appl. No.: 10/235,351

(22) Filed: Sep. 5, 2002

(51) Int. Cl.[7] ............................................... A47B 81/06
(52) U.S. Cl. .................................... 312/7.2; 312/223.1
(58) Field of Search ............................. 312/7.2, 223.1, 312/223.2, 257.1, 265.1, 265.2, 265.3, 265.4, 265.5; 211/26, 189, 190; 361/683, 724, 725, 726, 727

(56) References Cited

U.S. PATENT DOCUMENTS

| | | | | |
|---|---|---|---|---|
| 5,288,049 A | * | 2/1994 | Hays | 248/298.1 |
| 5,388,032 A | | 2/1995 | Gill et al. | |
| 5,505,533 A | | 4/1996 | Kammersqard et al. | |
| 5,873,480 A | | 2/1999 | Wells, Jr. | |
| 5,896,273 A | | 4/1999 | Varghese et al. | |
| 5,971,506 A | | 10/1999 | Dubin | |
| 6,021,909 A | | 2/2000 | Tang et al. | |
| 6,095,345 A | | 8/2000 | Gibbons | |
| 6,097,604 A | * | 8/2000 | Hunter et al. | 361/727 |
| 6,179,133 B1 | * | 1/2001 | Reece | 211/26 |
| 6,181,549 B1 | | 1/2001 | Mills et al. | |
| 6,266,250 B1 | | 7/2001 | Foye | |

FOREIGN PATENT DOCUMENTS

| | | | | |
|---|---|---|---|---|
| DE | 2853367 | * | 6/1980 | 312/7.2 |
| DE | 3002310 | * | 7/1981 | 312/7.2 |
| GB | 2127227 | * | 4/1984 | 312/223.1 |

* cited by examiner

Primary Examiner—James O. Hansen
(74) Attorney, Agent, or Firm—Marvin E. Jacobs

(57) ABSTRACT

A rack mount capable of housing an LCD display, LCD monitor, television, CRT, or other like display. The rack mount is preferably of knock down construction, but certain portions of the rack mount may alternatively be of unitary construction, and may be assembled quickly and easily. The rack mount is adjustable to accommodate displays, monitors, televisions, CRT's, or other like displays having different depths, may be mounted in an EIA (Electronics Industry Association) equipment rack, and provides a VESA (Video Electronics Standards Association) standard mounting hole pattern for mounting the display, monitor, television, CRT, or other like display thereto. The rack mount is capable of allowing cables of the display, monitor, television, CRT, or other like display to be fed to a space rear of the rack mount, and facilitate fastening appliances, accessories, cable ties, and/or the cables from the display, monitor, television, CRT, or other like display thereto.

21 Claims, 4 Drawing Sheets

RACK MOUNT

BACKGROUND OF THE INVENTION

1. Field of the Invention

The present invention relates generally to rack mounts and more particularly to rack mounts for monitors, displays, televisions, CRT's, and the like.

2. Background Art

Rack mounts for mounting electronic equipment and the like have been known. However, with the advent of LCD displays, and in particular TFT LCD displays and monitors, there is a need for a rack mount for housing such a display. The rack mount should be capable of housing the display, monitor, television, CRT, or other like display, and being mounted in a rack, which may accommodate at least one such rack mount. Thus, a plurality of rack mounts, each housing the display, monitor, television, CRT, or other like display, should be capable of being housed in a rack. The rack mount should preferably be of knock down construction, but certain portions of the rack mount may alternatively be of unitary construction, and should be capable of being assembled quickly and easily. The rack mount should be adjustable to accommodate displays, monitors, televisions, CRT's, or other like displays having different depths. The rack mount should also be capable of being mounted in an EIA (Electronics Industry Association) equipment rack, and provide a VESA (Video Electronics Standards Association) standard mounting hole pattern for mounting the display, monitor, television, CRT, or other like display thereto. The rack mount should be capable of allowing cables of the display, monitor, television, CRT, or other like display to be fed to a space rear of the rack mount, and facilitate fastening appliances, accessories, cable ties, and/or the cables from the display, monitor, television, CRT, or other like display thereto. The display, monitor, television, CRT, or other like display should be capable of being removably installed in the rack mount quickly and easily, and the rack mount should be capable of being removably installed in the equipment rack quickly and easily. The rack mount should be durable, long lasting, attractive, sturdy, and of simple construction.

Different rack mounts have heretofore been known. However, none of the rack mounts adequately satisfies these aforementioned needs.

U.S. Pat. No. 5,388,032 (Gill, et al.) discloses a computer equipment monitor and discriminator in an electronic equipment rack, having a storage drawer slidably mountable within the equipment rack, a display, pivotally connected to the storage drawer, a keyboard, removably mounted to the storage drawer, and a discriminator device for selecting one of a plurality of computers within the rack.

U.S. Pat. No. 5,505,533 (Kammersqard, et al.) discloses a rack mount for computer and mass storage enclosure, comprising a chassis for housing a standard desk-top mounted electronic computer for juxtaposed mating with computer accessories in an EIA-configured rack.

U.S. Pat. No. 5,873,480 (Wells, Jr.) discloses an electronic rack and mounting frame for protecting sensitive electronic equipment against damage caused by impact and excessive vibration during shipping and handling.

U.S. Pat. No. 5,896,273 (Varghese, et al.) discloses a modular computer chassis for both rack mounting and free standing use, comprising a housing adapted for receipt of a plurality of computer modules in a secured array. The modules are selectively accessible only through a cover panel door, which may be locked to secure the integrity of the array, and are mounted in the chassis on individual slides, which afford alignment and stability in the assembly thereof.

U.S. Pat. No. 5,971,506 (Dubin) discloses a system and method for converting a desk top computer into a rack mounted computer, which includes mounting the chassis of the desk top computer in a carrier tray. The carrier tray is then mounted in means for sliding the carrier tray in and out of an electrical equipment rack.

U.S. Pat. No. 6,021,909 (Tang, et al.) discloses an equipment enclosure rack support rail system, comprising an elongated support rail, including an elongated side portion adapted to mount directly to the rack, and an elongated base portion adapted to directly support an equipment component, and further comprising a low profile tie-down clamp, which is securely mountable to the support rail to secure the equipment component supported by the support rail. The support rail of the system is further provided with a pair of upper alignment tabs and a pair of lower alignment tabs, which extend rearward from the side portion of the support rail. One upper alignment tab and one lower alignment tab are positioned at each end of the support rail, and are vertically spaced a fraction of an EIA-U from each other, such that the lower alignment tabs can be used to mount the rail in a whole EIA-U position, and the upper alignment tabs can be used to mount the rail and equipment component in a fractional EIA-U position.

U.S. Pat. No. 6,095,345 (Gibbons) discloses a mounting bracket for an electronics rack, having a rack structure defining a plurality of holes spaced along the rack structure, to define retma (U) mounting unit increments of the rack. The plurality of holes are spaced along the vertical rack structure in a pattern substantially conforming to an Electronics Industry Association (EIA) standard. The mounting bracket includes a mounting bracket body, a first alignment structure extending from the mounting bracket body, and a second alignment structure extending from the mounting bracket body. The first alignment structure and the second alignment structure each are adapted to engage a hole of the rack structure, so as to align the bracket in a position along the rack structure, the first alignment structure and the second alignment structure being spaced apart, such that the bracket is alignable along the rack structure both at positions corresponding to whole retma unit increments and at positions corresponding to half retma unit increments. Electronic devices such as computer system servers may be mounted in the rack.

U.S. Pat. No. 6,181,549 (Mills, et al.) discloses a chassis retaining system for securing a chassis supporting electronic equipment, such as a computer system to a rack. The chassis retaining system includes a handle and a securing device, with a retaining surface. The securing device is coupled to the handle, and the retaining surface is movable with respect to the handle. The chassis retaining system further includes a user interface device coupled to the handle and to the securing device. The user interface device is movable with respect to the handle. The user interface device is engageable by a user to move the retaining surface from a first position with respect to the handle, wherein a surface of the electronics rack in which a chassis is mounted retains the retaining surface, to a second position, wherein the surface of the electronics rack does not retain the retaining surface.

U.S. Pat. No. 6,266,250 (Foye) discloses a modular electronics mounting system having a support plate, which includes a grid of holes arranged in at least one pair of columns spaced apart by a selected distance, at a predetermined interval, and a module formed generally as a plate, such that an electronic component may be mounted thereto. The support plate is configured to be mounted to a wall, such that the grid is spaced apart from the wall. The module includes a pair of hooks extending from a first edge thereof. The hooks are spaced apart by the column spacing, such that the hooks may be arranged to extend through first and second holes in the grid. A locking pin extends from the module, such that the locking pin extends into a corresponding third hole in the grid to restrain the module against movement parallel to the support plate. The module further includes a passage, that is aligned with a fourth hole in the grid, when the hooks and locking pin are in their respective holes. The modular electronics mounting system further includes a locking pin configured for insertion into the passage and through the fourth hole in the grid, the locking pin being arranged to restrain the module against movement away from the support plate.

For the foregoing reasons, there is a need for a rack mount capable of housing an LCD display, LCD monitor, television, CRT, or other like display therein, and being mounted in a rack, which may hold one or a plurality of the rack mounts. The rack mount should preferably be of knock down construction, but certain portions of the rack mount may alternatively be of unitary construction, and should be capable of being assembled quickly and easily. The rack mount should be adjustable to accommodate displays, monitors, televisions, CRT's, or other like displays having different depths. The rack mount should also be capable of being mounted in an EIA (Electronics Industry Association) equipment rack, and provide a VESA (Video Electronics Standards Association) standard mounting hole pattern for mounting the display, monitor, television, CRT, or other like display thereto. The rack mount should be capable of allowing cables of the display, monitor, television, CRT, or other like display to be fed to a space rear of the rack mount, and facilitate fastening appliances, accessories, cable ties, and/or the cables from the display, monitor, television, CRT, or other like display thereto. The display, monitor, television, CRT, or other like display should be capable of being removably installed in the rack mount quickly and easily, and the rack mount should be capable of being removably installed in the equipment rack quickly and easily. The rack mount should be durable, long lasting, attractive, sturdy, and of simple construction.

SUMMARY

The present invention is directed to a rack mount capable of housing an LCD display, LCD monitor, television, CRT, or other like display, the rack mount capable of being mounted in a rack, which may hold one or a plurality of the rack mounts. The rack mount is preferably of knock down construction, but certain portions of the rack mount may alternatively be of unitary construction, and may be assembled quickly and easily. The rack mount is adjustable to accommodate displays, monitors, televisions, CRT's, or other like displays having different depths. The rack mount may be mounted in an EIA (Electronics Industry Association) equipment rack, and provides a VESA (Video Electronics Standards Association) standard mounting hole pattern for mounting the display, monitor, television, CRT, or other like display thereto. The rack mount is capable of allowing cables of the display, monitor, television, CRT, or other like display to be fed to a space rear of the rack mount, and facilitate fastening appliances, accessories, cable ties, and/or the cables from the display, monitor, television, CRT, or other like display thereto. The display, monitor, television, CRT, or other like display may be removably installed in the rack mount quickly and easily, and the rack mount may removably installed in the equipment rack quickly and easily. The rack mount is durable, long lasting, attractive, sturdy, and of simple construction.

A rack mount for housing a display, monitor, television, CRT, or other like display, having features of the present invention comprises: a face plate having a first substantially rectangular hole therein, adapted for viewing the display, monitor, television, CRT, or other like display therethrough, a second substantially rectangular hole therein for accessing a portion of the display, monitor, television, CRT, or other like display therethrough, and means for mounting the rack mount thereto a rack; bezels fastened thereto the face plate adjacent the first substantially rectangular hole and extending thereinto the first substantially rectangular hole at a substantially minimal glare reflecting angle therefrom the face plate; retaining brackets fastened thereto the face plate adjacent the second substantially rectangular hole and extending thereinto the second substantially rectangular hole; a substantially rectangular cover plate removably fastened thereto the retaining brackets, and covering the second substantially rectangular hole, when the substantially rectangular cover plate is fastened thereto the retaining brackets; an H shaped back plate having means for mounting the display, monitor, television, CRT, or other like display thereto; L shaped brackets, fastened thereto the face plate; U shaped brackets fastened thereto the H shaped back plate and the L shaped brackets; and the rack mount having slot means for adjusting depth of the rack mount, the U shaped brackets and the L shaped brackets fastened one to the other at the slot means for adjusting the depth.

DRAWINGS

These and other features, aspects, and advantages of the present invention will become better understood with regard to the following description, appended claims, and accompanying drawings where:

DESCRIPTION

Figure 1:
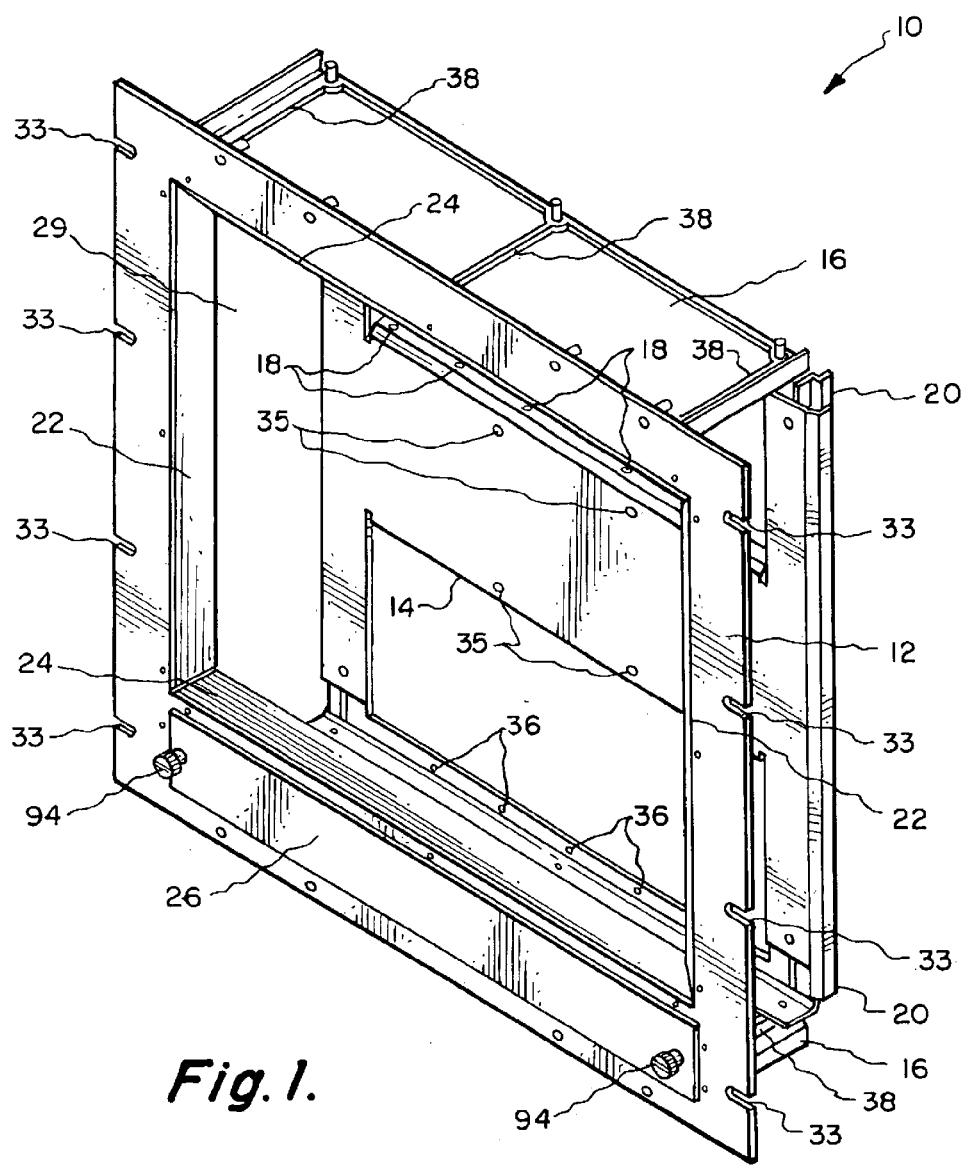
FIG. 1 is a perspective view of a rack mount, constructed in accordance with the present invention.
Figure 2:
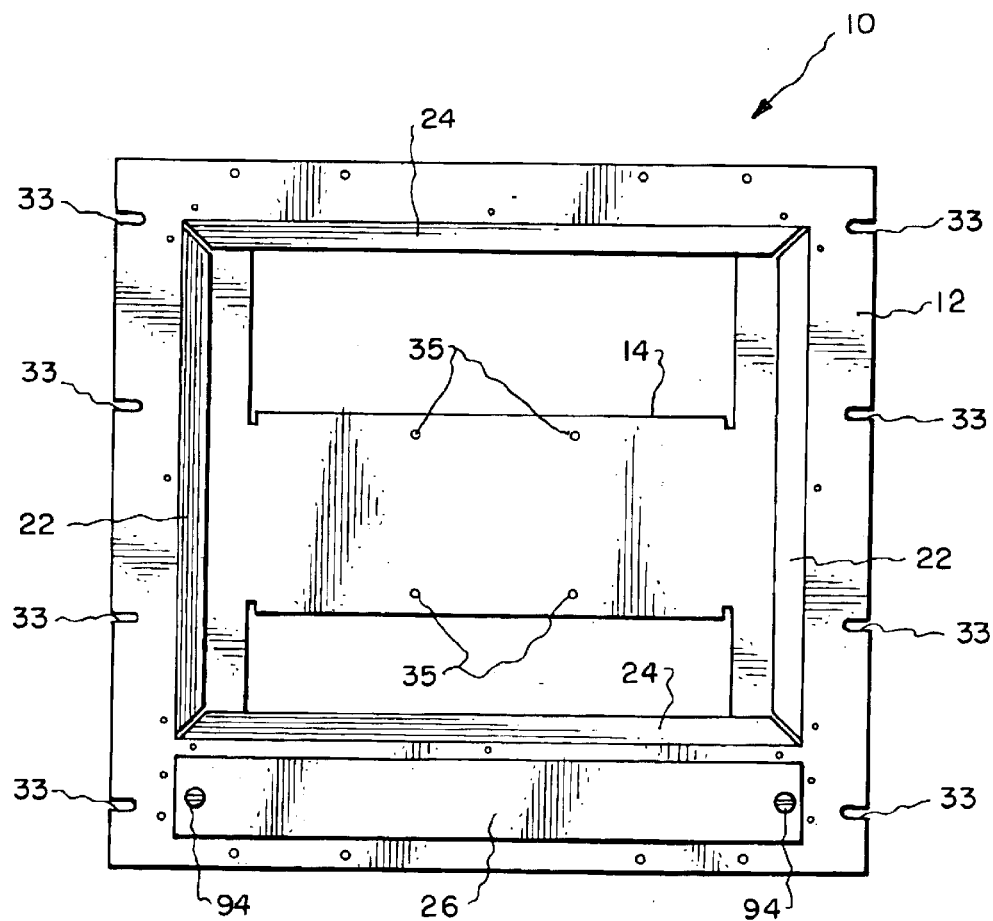
FIG. 2 is a front view of the rack mount.
Figure 3:
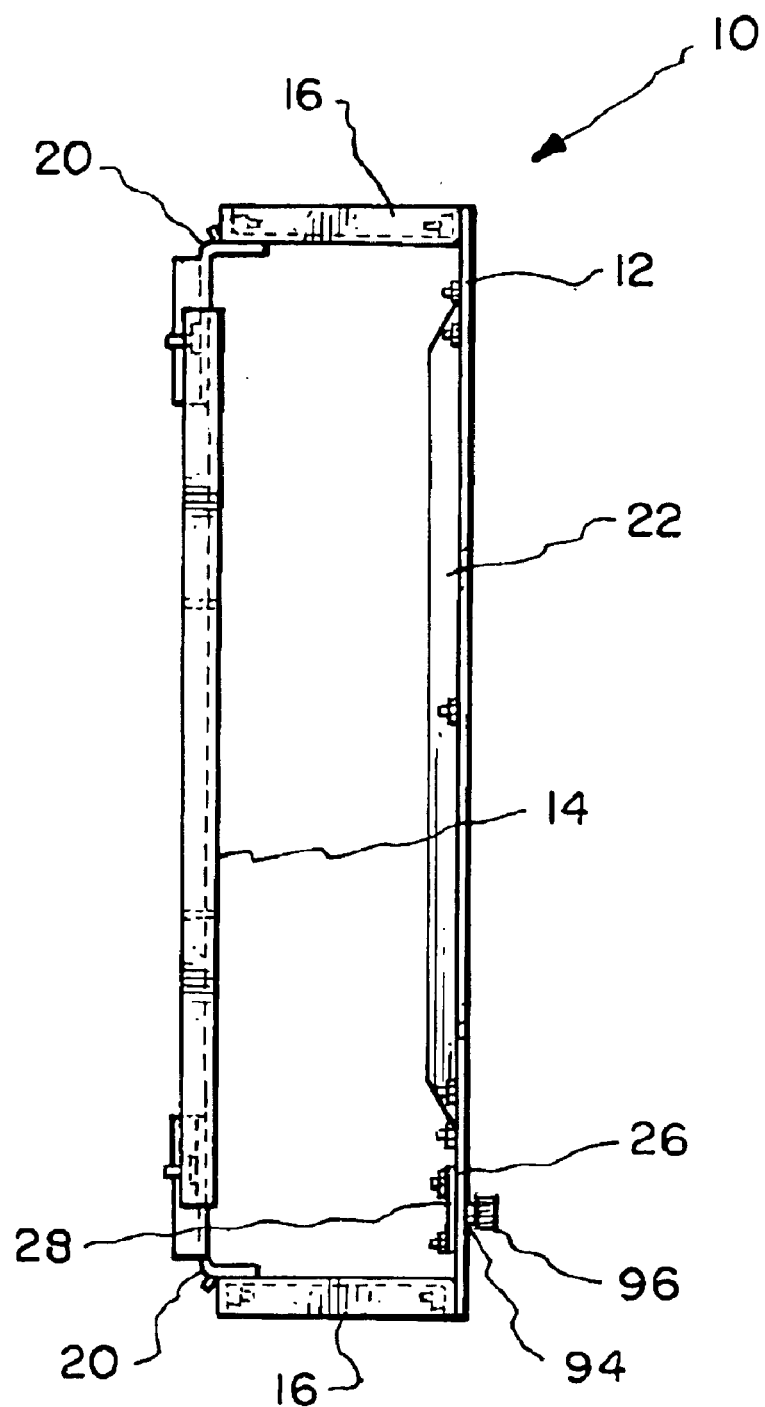
FIG. 3 is a side view of the rack mount.
Figure 4:
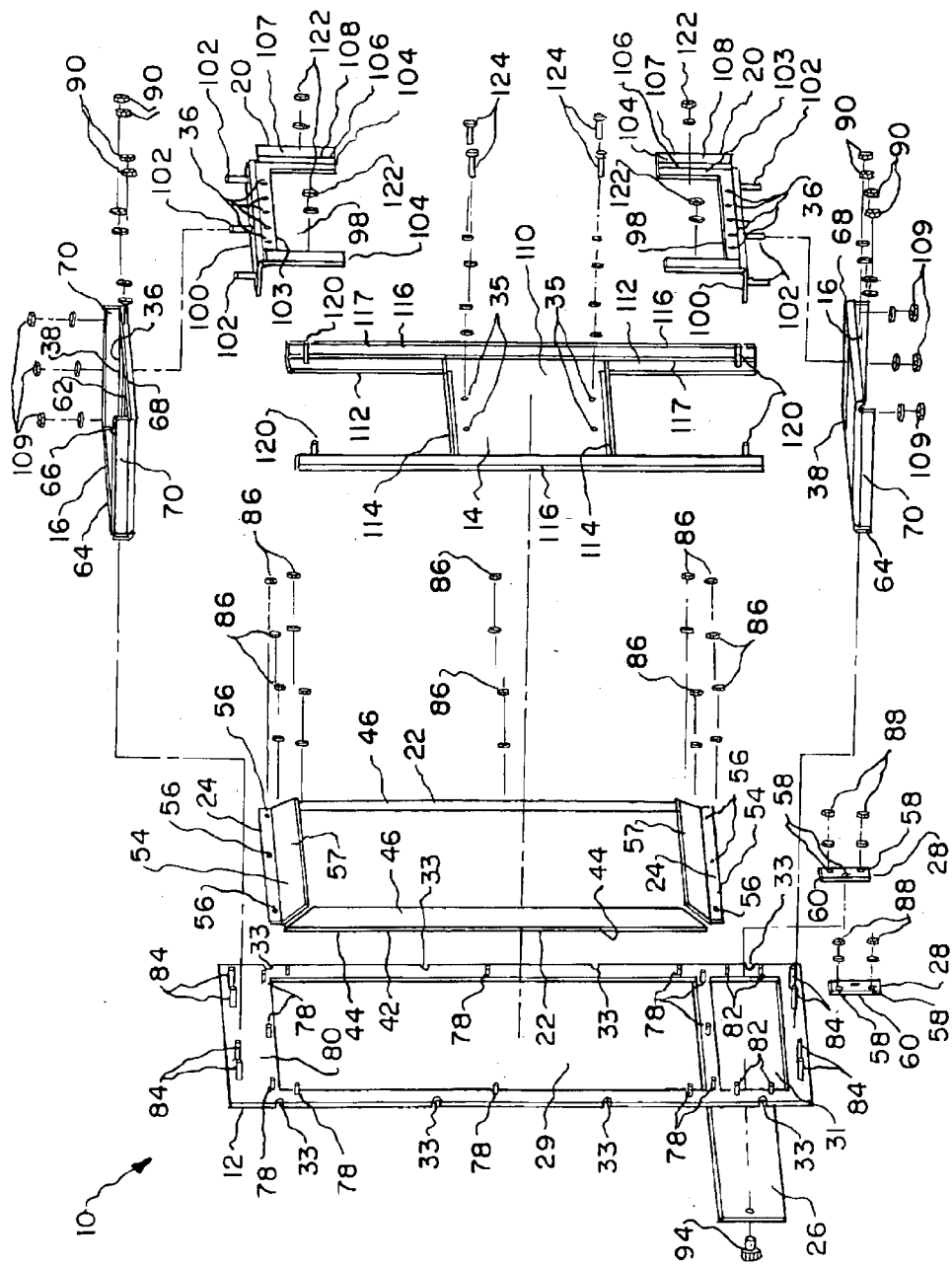
FIG. 4 is an exploded view of the rack mount.

The preferred embodiments of the present invention will be described with reference to FIGS. 1–4 of the drawings. Identical elements in the various figures are identified with the same reference numbers.

FIGS. 1–4 show a rack mount 10 for housing a display, monitor, television, CRT, or other like display, comprising face plate 12, back plate 14, L brackets 16, U brackets 20, bezels 22 and 24, control panel cover plate 26, and retaining brackets 28. The face plate 12 has substantially rectangular hole 29, adapted for viewing the display of the display, monitor, television CRT, or other like display therethrough, and substantially rectangular hole 31, adapted for accessing controls and/or a front portion of the display, monitor, television, CRT, or other like display therethrough, and for receiving the control panel cover plate 26.

The face plate 12 and the back plate 14 are substantially parallel one to the other, and substantially perpendicular to the L brackets 16, the L brackets 16 being substantially parallel one to the other. The face plate 12 has notches 33, which are adapted to facilitate mounting the rack mount 10 thereto a rack. The back plate 14 is substantially H shaped, and is adapted to allow cables of the display, monitor, television, CRT, or other like display to be fed to a space rear of the rack mount 10. The back plate 14 has holes 35, which are adapted to facilitate fastening the display, monitor, television, CRT, or other like display thereto. The U brackets 20 have holes 36, which are adapted to facilitate fastening the display, monitor, television, CRT, or other like display thereto.

The bezels 22 and 24 are angled at a substantially 45 degree angle therefrom the display of the display, monitor, television, CRT, or other like display for minimizing glare and/or reflections therefrom the bezels 22 and 24, when the display, monitor, television, CRT, or other like display is housed therein the rack mount 10.

The L brackets 16 have slots 38 adapted to adjust the depth of the rack mount 10, to house one of different monitors, televisions, CRT's, or other like displays having different depths.

Each of the bezels 22 has mounting side 42 having holes 44 therethrough, and substantially trapezoidal shaped bezel side 46 angled substantially 45 degrees therefrom the mounting side 42, and each of the bezels 24 has mounting side 54 having holes 56 therethrough, and substantially trapezoidal shaped bezel side 57 angled substantially 45 degrees therefrom the mounting side 54. Each of the retaining brackets 28 are substantially rectangular, and have holes 58 and threaded bole 60 therethrough. Each of the L brackets 16 are substantially L shaped, and have sides 62 and 64, which are substantially perpendicular one to the other, each of the sides 64 having holes 66 therethrough. Each of the L brackets 16 also has upturned side 68 opposing the side 64, and upturned ends 70, the side 64 and the upturned side 68 forming a channel for increased strength and structural rigidity, and the upturned ends 70 also increasing strength and structural rigidity of the L brackets 16. The sides 62 of the L brackets 16 are substantially planar, and have the slots 38 therein.

The face plate 12 has studs 78 fastened thereto back 80 thereof the face plate 12, for fastening the bezels 22 and 24, studs 82 for fastening the retaining brackets 28 thereto, and studs 84 for fastening the L brackets 16 thereto with lock nuts 86, 88, and 90, respectively, although other suitable fasteners may be used. The bezels 22 and 24 are fastened thereto the face plate 12 by inserting the studs 78 therethrough the bezel mounting side holes 44 and 56, respectively, and fastening the lock nuts 86 thereto the studs 78. The retaining brackets 28 are fastened thereto the face plate 12 by inserting the studs 82 therethrough the retaining bracket holes 58, and fastening the lock nuts 88 thereto the studs 82, and the L brackets 16 are fastened thereto the face plate 12 by inserting the studs 84 therethrough the L bracket holes 66, and fastening the lock nuts 90 thereto the studs 84.

The control panel cover plate 26 has holes 92, and is removably fastened thereto the retaining brackets 28 therewith threaded fasteners 94, each of the threaded fasteners 94 having a knurled head 96 to facilitate removably fastening the control panel cover plate 26 thereto and therefrom the retaining brackets 28 quickly and easily, although other suitable fasteners may be used. The control panel cover plate 26 is removably fastened thereto the retaining brackets 28 by inserting the threaded fasteners 94 thereinto the holes 92, and fastening the threaded fasteners 94 thereto the threaded holes 60 thereof the retaining brackets 28, with the knurled head 96 abutting the control panel cover plate 26.

Each of the U brackets 20 has side 98, which is substantially U shaped, and side 100, which is substantially perpendicular to the substantially U shaped side 98. The side 100 has studs 102, and the substantially U shaped side 98 has base side 103, which has the holes 36, which are adapted to facilitate fastening the display, monitor, television, CRT, or other like display thereto, and sides 104, which have slots 106. Each of the U brackets 20 also have substantially upturned sides 107, which are substantially perpendicular to the sides 104, and form corners 108, for increased strength and structural rigidity. The studs 102 are inserted therethrough the slots 38 of the sides 62 of the L brackets 16, and lock nuts 109, or other suitable fasteners, are placed about the studs 102. The depth of the rack mount 10 is adjusted by sliding the studs 102 therein the slots 38 to an appropriate position, and the lock nuts 109, or other suitable fasteners, are fastened thereto the studs 102.

The back plate 14, which is H shaped, has substantially planar portion 110 and leg portions 112. The substantially planar portion 110 is substantially centrally disposed in the back plate 14, and has substantially upturned sides 114, for increased strength and structural rigidity, and the leg portions 112 have substantially upturned sides 116, forming comers 117, for increased strength and structural rigidity. The substantially planar portion 110 has the holes 35, which are adapted to facilitate fastening the display, monitor, television, CRT, or other like display thereto, and the upturned sides 114 have holes 118, which are adapted to facilitate fastening appliances, accessories, cable ties, and/or the cables from the display, monitor, television, CRT, or other like display thereto. The leg portions 112 have studs 120 for fastening the back plate 14 thereto the sides 104 of the U brackets 20. The studs 120 are inserted therethrough the slots 106 of the U brackets 20, and lock nuts 122, or other suitable fasteners, are placed about the studs 120. The position of the back plate 14 is adjusted therein the slots 106, and the lock nuts 122, or other suitable fasteners, are fastened thereto the studs 120, with the leg portions 112 of the back plate 14 abutting the sides 104 of the U brackets 20, and the upturned sides 107 of the U brackets 20 abutting the substantially upturned sides 116 of the back plate 14, the comers 108 of the U brackets 20 and the comers 117 of the back plate 14 matingly abutting one another, for increased strength and structural rigidity.

Screws 124, or other suitable fasteners, may be used with optional washers to fasten the display, monitor, television, CRT, or other like display thereto the back plate 14. Optional washers, may also be used about the studs, therebetween the lock nuts and components of the rack mount 10.

The rack mount 10 is preferably of knock down construction; however, certain portions of the rack mount 10 may alternatively be of unitary construction. The rack mount 10 is capable of being assembled quickly and easily. The rack mount 10 may be of metal, such as aluminum or steel, thermoplastics, thermosetting polymers, rubber, or other suitable material or combination thereof. The rack mount 10 may be painted or left in an as-is condition.

The rack mount 10 is capable of being mounted in an EIA (Electronics Industry Association) equipment rack, and provides a VESA (Video Electronics Standards Association) standard mounting hole pattern for mounting the display, monitor, television, CRT, or other like display thereto, the face plate 12 having the notches 33, which are adapted to facilitate mounting the rack mount 10 thereto an EIA equipment rack, and the back plate 14 having the holes 35, which are adapted to facilitate fastening the display, monitor, television, CRT, or other like display thereto in the required VESA mounting hole pattern. The display, monitor, television, CRT, or other like display are capable of being removably installed in the rack mount 10 quickly and easily, and the rack mount 10 is capable of being removably installed in the equipment rack quickly and easily. The rack mount 10 is durable and long lasting.

Although the present invention has been described in considerable detail with reference to certain preferred versions thereof, other versions are possible. Therefore, the spirit and scope of the appended claims should not be limited to the description of the preferred versions contained herein.

What is claimed is:

1. A rack mount for housing a display, monitor, television or CRT comprising:
   a face plate,
      a first substantially rectangular hole in said face plate, adapted for viewing said display, monitor, television or CRT, through said hole
      a second substantially rectangular hole in said face plate for accessing a portion of said display, monitor, television or CRT, through said second hole and said face plate having means for mounting said rack mount to a rack;
   bezels,
      said bezels fastened to said face plate adjacent said first substantially rectangular hole and extending into said first substantially rectangular hole;
   retaining brackets,
      said retaining brackets fastened to said face plate adjacent said second substantially rectangular hole and extending into said second substantially rectangular hole;
   a substantially rectangular cover plate,
      said substantially rectangular cover plate removably fastened to said retaining brackets, and covering said second substantially rectangular hole, when said substantially rectangular cover plate is fastened to said retaining brackets;
   an H shaped back plate,
      said H shaped back plate having means for mounting to said display, monitor, television or CRT;
   L shaped brackets,
      said L shaped brackets fastened to said face plate;
   U shaped brackets,
      said U shaped brackets fastened to said H shaped back plate and said L shaped brackets; and
   said rack mount having slot means for adjusting depth of said rack mount.

2. The rack mount according to claim 1, wherein said bezels are adapted to extend into said first substantially rectangular hole at a substantially forty five degree angle from said face plate.

3. The rack mount according to claim 1, wherein said means for mounting said rack mount to said rack comprises said face plate having slots adapted to insert fasteners through and into said rack.

4. The rack mount according to claim 1, wherein said means for mounting said display, monitor, television or CRT to said H shaped back plate comprises said H shaped back plate having holes adapted to insert fasteners and into said display, monitor, television or CRT.

5. The rack mount according to claim 1, wherein said slot means for adjusting said depth of said rack mount comprises slots in said L shaped brackets.

6. The rack mount according to claim 5, wherein said U shaped brackets are fastened to said L shaped brackets at said slots, said U shaped brackets having fasteners extending from and extending through said slots.

7. The rack mount according to claim 1, wherein said H shaped back plate has means for fastening items from said display, monitor, television or CRT to said H shaped back plate.

8. The rack mount according to claim 1, wherein said H shaped back plate is adapted to allow cables from said display, monitor, television or CRT to be fed through said H shaped back plate.

9. The rack mount according to claim 1, wherein said rack mount is of knock down construction.

10. The rack mount according to claim 1, wherein said rack mount is constructed of materials from the group consisting of metals, thermoplastics, thermosetting polymers, and rubber, or combination thereof.

11. A rack mount for housing a display, monitor, television or CRT, comprising:
    a face plate,
       a first substantially rectangular hole, in said face plate adapted for viewing said display, monitor, television or CRT, through said first hole
       a second substantially rectangular hole through said face plate for accessing through said second hole a portion of said display, monitor, television or CRT, and
       said face plate having means for mounting said rack mount to a rack;
    bezels,
       said bezels fastened to said face plate adjacent said first substantially rectangular hole and extending into said first substantially rectangular hole at a substantially minimal glare reflecting angle from said face plate;
    retaining brackets,
       said retaining brackets fastened to said face plate adjacent said second substantially rectangular hole and extending into said second substantially rectangular hole;
    a substantially rectangular cover plate,
       said substantially rectangular cover plate removably fastened to said retaining brackets, and covering said second substantially rectangular hole, when said substantially rectangular cover plate is fastened to said retaining brackets;
    an H shaped back plate,
       said H shaped back plate having means for mounting said display, monitor, television or CRT;
    L shaped brackets,
       said L shaped brackets fastened to said face plate;
    U shaped brackets,
       said U shaped brackets fastened to said H shaped back plate and said L shaped brackets; and
    said rack mount having slot means for adjusting depth of said rack mount,
       said U shaped brackets and said L shaped brackets fastened one to the other at said slot means for adjusting said depth.

12. The rack mount according to claim 11, wherein said bezels extend into said first substantially rectangular hole at a substantially forty five degree angle from said face plate.

13. The rack mount according to claim 12, wherein said means for mounting said rack mount to said rack comprises said face plate having slots adapted to insert fasteners through and into said rack.

14. The rack mount according to claim 13, wherein said means for mounting said display, monitor, television or CRT to said H shaped back plate comprises said H shaped back plate having holes adapted to insert fasteners through and into said display, monitor, television CRT.

15. The rack mount according to claim 14, wherein said slot means for adjusting said depth of said rack mount comprises slots, in said L shaped brackets.

16. The rack mount according to claim 15, wherein said U shaped brackets are fastened to said L shaped brackets at said slots, said U shaped brackets having fasteners extending from and extending through said slots.

17. The rack mount according to claim 16, wherein said H shaped back plate has means for fastening items from said display, monitor, television or CRT said H shaped back plate.

18. The rack mount according to claim 17, wherein said H shaped back plate is adapted to allow cables from said display, monitor, television or CRT to be fed through said H shaped back plate.

19. The rack mount according to claim 18, wherein said portion of said display, monitor, television or CRT comprises controls for controlling said display, monitor, television or CRT.

20. The rack mount according to claim 11, wherein said rack mount is of knock down construction.

21. The rack mount according to claim 11, wherein said rack mount is constructed of materials from the group consisting of metals, thermoplastics, thermosetting polymers, and rubber, or combination thereof.

* * * * *